United States Patent
Jiang et al.

(10) Patent No.: US 11,626,484 B2
(45) Date of Patent: Apr. 11, 2023

(54) HIGH EFFICIENCY ROOM TEMPERATURE INFRARED SENSOR

(71) Applicant: Wisconsin Alumni Research Foundation, Madison, WI (US)

(72) Inventors: Hongrui Jiang, Madison, WI (US); Seyyed Mohammad J. Moghimi, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 531 days.

(21) Appl. No.: 15/710,147

(22) Filed: Sep. 20, 2017

(65) Prior Publication Data

US 2019/0088741 A1 Mar. 21, 2019

(51) Int. Cl.
| | |
|---|---|
| *H01L 29/06* | (2006.01) |
| *G01J 1/42* | (2006.01) |
| *H01L 21/02* | (2006.01) |
| *H01L 31/101* | (2006.01) |
| *H01L 31/0352* | (2006.01) |
| *H01L 31/18* | (2006.01) |
| *G01J 5/20* | (2006.01) |
| *G01J 5/08* | (2022.01) |
| *G01J 5/02* | (2022.01) |

(52) U.S. Cl.
CPC ............ *H01L 29/0669* (2013.01); *G01J 1/42* (2013.01); *G01J 5/0225* (2013.01); *G01J 5/0853* (2013.01); *G01J 5/20* (2013.01); *H01L 21/02603* (2013.01); *H01L 29/0665* (2013.01); *H01L 31/035227* (2013.01); *H01L 31/101* (2013.01); *H01L 31/1804* (2013.01)

(58) Field of Classification Search
CPC ............ H01L 29/0669; H01L 31/1804; H01L 31/035227; H01L 31/101; H01L 21/02603; H01L 29/0665; G01J 5/0225; G01J 5/0853; G01J 5/20; G01J 1/42; Y02P 70/50
See application file for complete search history.

(56) References Cited

U.S. PATENT DOCUMENTS

| | | | |
|---|---|---|---|
| 6,690,014 B1 | 2/2004 | Gooch et al. | |
| 8,829,452 B1 * | 9/2014 | Brown ............ | H01L 31/035218 250/370.07 |
| 9,263,519 B2 * | 2/2016 | Lal .......... | B82Y 10/00 |
| 2007/0190368 A1 | 8/2007 | Jung et al. | |
| 2009/0140148 A1 * | 6/2009 | Yang ......... | G01J 5/20 438/57 |
| 2011/0168894 A1 * | 7/2011 | Bratkovski .......... | G02B 19/009 977/932 |

(Continued)

FOREIGN PATENT DOCUMENTS

| | | | | |
|---|---|---|---|---|
| CN | 103229358 A | * | 7/2013 | ............. B82Y 30/00 |
| JP | 5149997 B2 | * | 2/2013 | ............. G01J 5/0815 |

*Primary Examiner* — Kiho Kim
(74) *Attorney, Agent, or Firm* — Boyle Fredrickson, S.C.

(57) ABSTRACT

An infrared (IR) detection sensor for detecting IR radiation. The IR detection sensor including a plurality of nanowires positioned adjacent to each other so as to define a layer. The layer has an outer surface directable towards a source of IR radiation. First and second terminals are electrically coupled to the layer and a circuit is electrically coupled to the first and second terminals. The circuit is configured to determine a value of an electrical property, such as the resistance, of the layer in response to the IR radiation absorbed by the layer.

19 Claims, 1 Drawing Sheet

(56) References Cited

U.S. PATENT DOCUMENTS

| | | |
|---|---|---|
| 2012/0154196 A1 | 6/2012 | Cincotti et al. |
| 2012/0185109 A1 | 7/2012 | Olson et al. |
| 2013/0093902 A1* | 4/2013 | Honda .................. H04N 5/33 |
| | | 348/164 |
| 2013/0248712 A1* | 9/2013 | Abdolvand ............ G01J 5/022 |
| | | 250/338.1 |
| 2014/0111364 A1 | 4/2014 | Sjolund |
| 2014/0247478 A1 | 9/2014 | Bates et al. |
| 2018/0337324 A1* | 11/2018 | Fong ..................... G01J 5/046 |

\* cited by examiner

HIGH EFFICIENCY ROOM TEMPERATURE INFRARED SENSOR

FIELD OF THE INVENTION

This invention relates generally to infrared (IR) detection sensors, and in particular, to a high efficiency, IR detection sensor that is operable at ambient temperatures and is capable of detecting IR radiation over a wide spectral band.

BACKGROUND AND SUMMARY OF THE INVENTION

An IR detection sensor is an electronic instrument which is used to sense IR radiation radiating from objects in the field of view of sensor. There are two types of sensors used for detection, namely, cryogenically cooled sensors and room temperature sensors. Cryogenically cooled sensors require very low temperature to operate and are required to be in contact with coolant materials, such as liquid nitrogen and helium. The cooling mechanisms of these cryogenically cooled sensors are cumbersome rendering the associated detectors slow and unsuitable for use in field. Moreover, the absorption bandwidth of the semiconductor materials used in cryogenically cooled sensors is limited, and hence, the cryogenically cooled sensors can only detect a specific spectral band. For wide band applications, multiple sensors are needed to sense various regions of the spectrum.

In contrast to cryogenically cooled sensors, room temperature sensors operate at ambient temperatures. Heretofore, the dominant technology for room-temperature sensing is micro-bolometers. Micro-bolometers include a detector material that absorbs IR radiation within a range of specific wavelengths. The IR radiation heats the detector material, thereby changing the electrical resistance of the detector material. The change in electrical resistance of the detector material creates a corresponding current or voltage signal that can be used to create an image.

The main drawback of prior micro-bolometers are their lack of efficiency. A large portion of the IR radiation is not absorbed by the detector material and the sensitivity of the detector material is very low. Many schemes have been proposed to increase the IR absorption of the detector materials in micro-bolometers. Yet, all of these schemes present major challenges. For example, in many commercial micro-bolometers, most of the IR radiation passes through the detector materials. As such, mirrors are positioned behind the detector materials to reflect the IR radiation back towards the detector materials. While this arrangement slightly increases the IR absorption abilities of the micro-bolometers, the IR absorption abilities of the micro-bolometers are still insufficient. Further, the reflected IR radiation can still exit the micro-bolometers. This fundamental problem is directly related to the properties of detector materials. Moreover, most prior micro-bolometers require exotic materials (e.g. vanadium oxide) that are incompatible with known microfabrication processes. As such, it is extremely difficult to miniaturize the pixels and produce high-resolution images with prior micro-bolometers.

Therefore, it is a primary object and feature of the present invention to provide a high efficiency, IR detection sensor that can operate at ambient temperatures.

It is a further object and feature of the present invention to provide a high efficiency, IR detection sensor that can produce high-resolution images.

It is a still further object and feature of the present invention to provide a high efficiency, IR detection sensor capable of detecting IR radiation over a wide spectral band.

It is a still further object and feature of the present invention to provide a high efficiency, IR detection sensor that is simple to utilize and inexpensive to manufacture.

In accordance with the present invention, an infrared (IR) detection sensor is provided for detecting IR radiation. The IR detection sensor includes a plurality of nanowires positioned adjacent to each other so as to define a layer. The layer has an outer surface directable towards a source of IR radiation. First and second terminals are electrically coupled to the layer. The first and second terminals connectable to a circuit for determining a value of an electrical property of the layer in response to the IR radiation engaging the layer.

A flexible membrane supports the layer above a supporting surface and an electrical insulator positioned between the layer and the membrane. Each nanowire of the plurality of nanowires is fabricated from silicon impregnated with silver nanoparticles. In addition, each nanowire of the plurality of nanowires includes a terminal first end partially defining an inner surface of the layer and a second end. The second end of each nanowire of the plurality of nanowires has a generally conical configuration and terminates at a tip. The tip at the second end of each nanowire of the plurality of nanowires partially defines the outer surface of the layer. The inner surface of the layer engages an electrical insulator.

In accordance with a further aspect of the present invention, an infrared (IR) detection sensor is provided for detecting IR radiation. The infrared detection sensor includes a plurality of nanowires forming a layer. The layer has an outer surface directable towards a source of IR radiation. A circuit is electrically coupled to the layer. The circuit is configured to determine a value of an electrical property of the layer in response to the IR radiation absorbed by the layer.

The IR detection sensor may also include first and second terminals electrically coupling the layer to the circuit and a flexible membrane for supporting the layer above a supporting surface. An electrical insulator is positioned between the layer and the membrane. Each nanowire of the plurality of nanowires is fabricated from silicon impregnated with silver nanoparticles. In addition, each nanowire of the plurality of nanowires includes a terminal first end partially defining an inner surface of the layer and a second end. The second end of each nanowire of the plurality of nanowires has a generally conical configuration and terminates at a tip. The tip at the second end of each nanowire of the plurality of nanowires partially defines the outer surface of the layer. The inner surface of the layer engages an electrical insulator.

In accordance with a still further aspect of the present invention, an infrared (IR) detection sensor is provided for detecting IR radiation. A plurality of nanowires are positioned adjacent to each other so as to define a layer. The layer has an outer surface directable towards a source of IR radiation. First and second terminals are electrically coupled to the layer and a circuit is electrically coupled to the first and second terminals. The circuit is configured to determine a value of an electrical property of the layer in response to the IR radiation absorbed by the layer.

A flexible membrane supports the layer above a supporting surface. The membrane electrically isolates from the layer by an electrical insulator. Each nanowire of the plurality of nanowires is fabricated from silicon impregnated with silver nanoparticles. In addition, each nanowire of the plurality of nanowires includes a terminal first end partially defining an inner surface of the layer and a second end. The second end of each nanowire of the plurality of nanowires has a generally conical configuration and terminates at a tip. The tip at the second end of each nanowire of the plurality of nanowires partially defines the outer surface of the layer. The inner surface of the layer engages an electrical insulator.

BRIEF DESCRIPTION OF THE DRAWINGS

The drawings furnished herewith illustrate a preferred construction of the present invention in which the above aspects, advantages and features are clearly disclosed as well as others which will be readily understood from the following description of the illustrated embodiments.

In the drawings.

DETAILED DESCRIPTION OF THE DRAWINGS

Figure 1:
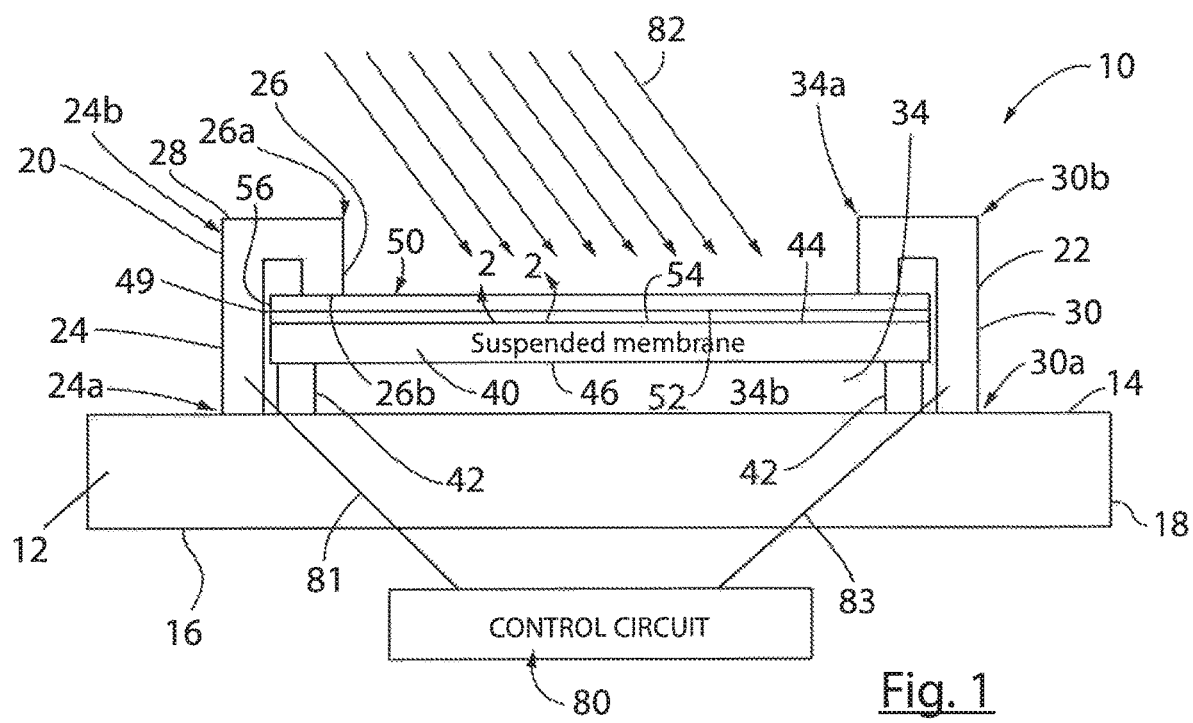
FIG. 1 is a schematic view of an IR detection sensor in accordance with the present invention.

Referring to FIG. 1, an IR detection sensor in accordance with the present invention is generally designated by the reference numeral 10. In the depicted embodiment, IR detection sensor 10 is supported on substrate 12. Substrate 12 may be fabricated from any suitable substrate material, such as a monolithic circuit, a printed circuit board or the like. Substrate 12 is defined by upper and lower surfaces 14 and 16, respectively, and an outer periphery 18. In the depicted embodiment, substrate 12 has a generally rectangular configuration. However, other configurations are possible without deviating from the scope of the present invention.

IR detection sensor 10 further includes first and second electrode arms 20 and 22, respectively, projecting from upper surface 14 of substrate 12. More specifically, first electrode arm 20 is generally U-shaped and includes first leg 24 having a first terminal end 24a operatively connected to upper surface 14 of substrate 12 and an opposite second end 24b. First electrode arm 20 further includes second leg 26 generally parallel to and spaced from first leg 24. Second leg 26 includes first end 26a electrically coupled to second end 24b of first leg 24 by arm 28 and second terminal end 26b vertically spaced from and generally parallel to upper surface 14 of substrate 12.

Second electrode arm 22 is generally U-shaped and includes first leg 30 having a first terminal end 30a operatively connected to upper surface 14 of substrate 12 at a location laterally spaced from first terminal end 24a of first leg 24 of first electrode arm 22 and an opposite second end 30b. Second electrode arm 22 further includes second leg 34 generally parallel to and spaced from first leg 24. Second leg 34 includes first end 34a electrically coupled to second end 32b of first leg 30 by arm 36 and second terminal end 34b vertically spaced from upper surface 14 of substrate 12.

IR detection sensor 10 further includes membrane 40 suspended over upper surface 14 of substrate 12. Membrane 40 is defined by upper and lower surfaces 44 and 46, respectively, and an outer periphery 48. In the depicted embodiment, membrane 40 has a generally rectangular configuration. However, other configurations are possible without deviating from the scope of the present invention. Posts 42 extend between lower surface 46 of membrane 40 and upper surface 14 of substrate 12 to suspend membrane 40 over substrate 12. Membrane 40 may be fabricated from a flexible or a rigid material having minimal thermal capacity. By way of example, it is contemplated to fabricate membrane 40 from silicon or the like.

Figure 2:
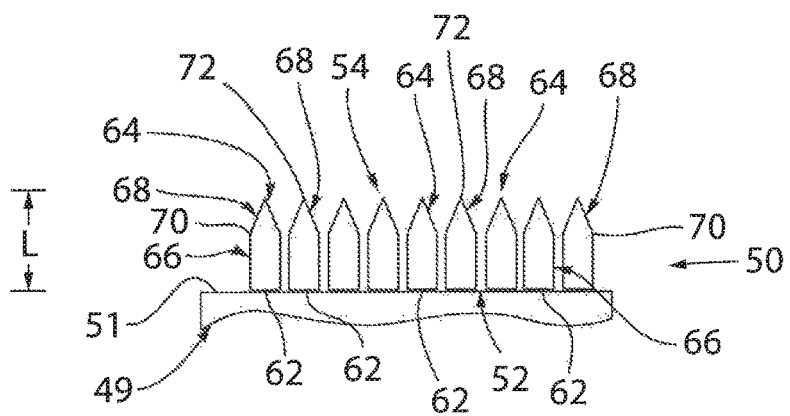
FIG. 2 is an enlarged schematic view of an IR detection sensor taken along line 2-2 of FIG. 1.

Insulation layer 49 is deposited on upper surface 44 of membrane 40. As best seen in FIG. 2, insulation layer 49 is fabricated from an electrical insulating material and includes an upper surface 51. It is intended for upper surface 51 of insulation layer 49 to receive absorption layer 50 thereon so as to electrically insulate absorption layer 50 from membrane 40. Absorption layer 50 of sensor 10 is fabricated from an IR absorptive material defined by inner and outer surfaces 52 and 54, respectively, and an outer periphery 56. Absorption layer 50 is electrically coupled to terminal ends 26b and 34b of second legs 26 and 34 of first and second electrode arms 20 and 22, respectively, in any conventional manner, for reasons hereinafter described.

Absorption layer 50 is constructed from a plurality nanowires 58 fabricated from silicon (SiNWs) impregnated with silver nanoparticles (AgNPs) and positioned adjacent each other, FIG. 2. Alternatively, nanowires 58 may be fabricated from simply silicon (SiNWs) or other materials, without deviating from the scope of the present invention. In order for absorption layer 50 to maximize absorption over a wide range of wavelengths ranging from visible to IR radiations, it is contemplated for each nanowire to have a length L in the range of 1 to 50 micrometers ($\mu$m), and preferably, in the range of 4 to 20 $\mu$m and a diameter in the range of 2 nanometers (nm) to 2 $\mu$m, and preferably, in the range of 20 to 400 nm. The silver nanoparticles have dimensions smaller than 200 nm. Each nanowire 58 has a first end 60 terminating at a generally flat end surface 62 and a second end 64. End surfaces 62 of the plurality of nanowires 58 define inner surface 52 of absorption layer 50. It is contemplated for inner surface 52 of absorption layer 50 (in other words, end surfaces 62 of nanowires 58) to be bonded to upper surface 51 of insulation layer 49 in any conventional manner, such as by an adhesive. A generally cylindrical portion 66 of each nanowires 58 projects from end surface 62 and is interconnected to a generally conical portion 68 at intersection 70. Conical portion 68 of each nanowire 58 terminates at tip 72 at second end 64 thereof. Tips 72 of conical portions 68 of the plurality of nanowires 58 define outer surface 54 of absorption layer 50. It is noted that while the depicted embodiment shows nanowires 58 with generally conical portions 68 at second ends 64 thereof, other configurations are possible without deviating from the scope of the present invention. For example, absorption layer 50 may be affixed to insulation layer 49 such that tips 72 of nanowires 58 define inner surface 52 and end surfaces 62 of nanowires 58 define outer surface 54. In addition, it is further contemplated for the portion of each nanowire 58 adjacent second end 64 to be engineered with an alternate configuration (e.g. cylinder, steeple-like, etc.) to facilitate IR absorption.

In operation, first and second electrode arms 20 and 22, respectively, of IR detection sensor 10 are electrically coupled to circuit 80 by lines 81 and 83, and IR detection sensor 10 is positioned such that outer surface 54 of absorption layer 50 may receive IR radiation, generally designated by the reference numeral 82, thereon. Incident IR radiation 82 engages and is absorbed by absorption layer 50. More specifically, incident IR radiation 82 becomes trapped between the SiNWs and the AgNPs of the plurality of nanowires 58 and is converted into thermal energy. It has been found that the density of nanowires 58 absorb incident IR radiation 82 on absorption layer 50 at an efficiency of over 98%. The thermal energy heats absorption layer 50 and modulates the surface resistivity thereof, thereby causing a measurable change in the resistance of absorption layer 50. Circuit 80 provides a constant voltage across the first and second electrode arms 20 and 22, respectively, of IR detection sensor 10 and senses a change in electrical current flowing through absorption layer 50 between first and second electrode arms 20 and 22, respectively. The magnitude of the change in electrical current varies with the amount of incident IR radiation 82 engaging absorption layer 50. This change in electrical current is processed by circuit 80 to create an image corresponding to the incident IR radiation 82 sensed by sensor 10. It has been found that for an absorption layer 50 fabricated with nanowires 58, as heretofore described, sensor 10 is effective for IR wavelengths in the range of 2.5 to 16.6 μm (4000 to 600 centimeters (cm)−1). Further, has been found that the resistance of absorption layer 50 fabricated with nanowires 58, as heretofore described, varies linearly with respect to the temperature of absorption layer 50, without any hysteresis.

Alternatively, it can be appreciated that circuit 80 may provide a constant electrical current across the first and second electrode arms 20 and 22, respectively, of IR detection sensor 10 and senses a change in voltage between first and second electrode arms 20 and 22, respectively. It can be appreciated that the magnitude of the change in voltage varies with the amount of incident IR radiation 82 engaging absorption layer 50. This change in voltage may processed by circuit 80 to create an image corresponding to the incident IR radiation 82 sensed by sensor 10.

It can be appreciated that the above descriptions of the device and method are merely exemplary of the present invention. Various modes of carrying out the invention are contemplated as being within the scope of the following claims particularly pointing out and distinctly claiming the subject matter, which is regarded as the invention.

We claim:

1. An infrared (IR) detection sensor for detecting IR radiation, comprising:
 a plurality of nanowires positioned adjacent to each other so as to define a layer, the layer having an outer surface directable towards a source of IR radiation and an inner surface;
 an electrical insulator having an upper surface in engagement with the inner surface of the layer and a lower surface;
 a membrane having an upper surface in engagement with the lower surface of the electrical insulator and a lower surface, the membrane having a minimal thermal capacity;
 a supporting surface having an upper surface directed towards the membrane so as to define a void between the supporting surface and the membrane, the lower surface of the membrane in communication with the void;
 a plurality of supports extending from the supporting surface and operatively engaging the membrane to suspend the membrane above the supporting surface;
 first and second terminals electrically coupled to the layer;
 a circuit electrically coupled to the first and second terminals, the circuit configured to:
  provide one of a constant voltage across the first and second terminals to generate an electrical current flowing through the layer and a constant electrical current across the first and second terminals to generate a voltage across the first and second terminals;
  monitor a change in the electrical current flowing through the layer in response to the IR radiation absorbed by the layer when the constant voltage is provided across the first and second terminals;
  monitor a change of the voltage across the first and second terminals in response to the IR radiation absorbed by the layer when the constant electrical current is provided across the first and second terminals; and
  determine the IR radiation absorbed by the layer in response to one of the monitored change in the electrical current flowing through the layer and the monitored change of the voltage across the first and second terminals;
 wherein the layer defines an uninterrupted electrical path from the first terminal to the second terminal and from the second terminal to the first terminal.

2. The IR detection sensor of claim 1 wherein the membrane is flexible.

3. The IR detection sensor of claim 1 wherein each nanowire of the plurality of nanowires is fabricated from silicon impregnated with silver nanoparticles.

4. The IR detection sensor of claim 1 wherein each nanowire of the plurality of nanowires includes a terminal first end partially defining an inner surface of the layer and a second end.

5. The IR detection sensor of claim 4 wherein the second end of each nanowire of the plurality of nanowires has a generally conical configuration and terminates at a tip.

6. The IR detection sensor of claim 5 wherein the tip at the second end of each nanowire of the plurality of nanowires partially defines the outer surface of the layer and wherein the inner surface of the layer engages an electrical insulator.

7. An infrared (IR) detection sensor for detecting IR radiation, comprising:
 a plurality of nanowires forming a layer, each of the plurality of nanowires and the layer having an outer surface directable towards a source of IR radiation and an inner surface;
 an electrical insulator having an upper surface in engagement with the inner surface of the layer and a lower surface;
 a membrane having an upper surface in engagement with the lower surface of the electrical insulator and a lower surface, the membrane having a minimal thermal capacity;
 a supporting surface having an upper surface directed towards the membrane so as to define a void between the supporting surface and the membrane, the lower surface of the membrane in communication with the void;
 a plurality of supports extending from the supporting surface and operatively engaging the membrane to suspend the membrane above the supporting surface;
 a circuit electrically coupled to the layer, the circuit configured to:
  provide one of a constant voltage across the layer to generate an electrical current flowing through the layer and a constant electrical current across the layer to generate a voltage across the layer;
  monitor a change in the electrical current flowing through the layer in response to the IR radiation absorbed by the layer when the constant voltage is provided across the first and second terminals;
  monitor a change of the voltage across the layer in response to the IR radiation absorbed by the layer when the constant electrical current is provided across the first and second terminals; and determine the IR radiation absorbed by the layer in response to one of the monitored change in the electrical current flowing through the layer and the monitored change of the voltage across the layer;
wherein the layer defines an uninterrupted electrical path from the first terminal to the second terminal and from the second terminal to the first terminal.

8. The IR detection sensor of claim 7 further comprising first and second terminals electrically coupling the layer to the circuit.

9. The IR detection sensor of claim 7 wherein the membrane is flexible.

10. The IR detection sensor claim 7 wherein each nanowire of the plurality of nanowires is fabricated from silicon impregnated with silver nanoparticles.

11. The IR detection sensor of claim 7 wherein each nanowire of the plurality of nanowires includes a terminal first end partially defining an inner surface of the layer and a second end.

12. The IR detection sensor of claim 11 wherein the second end of each nanowire of the plurality of nanowires has a generally conical configuration and terminates at a tip.

13. The IR detection sensor of claim 12 wherein the tip at the second end of each nanowire of the plurality of nanowires partially defines the outer surface of the layer and wherein the inner surface of the layer engages an electrical insulator.

14. An infrared (IR) detection sensor for detecting IR radiation, comprising:
a plurality of nanowires positioned adjacent to each other so as to define a layer, each of the plurality of nanowires and the layer having an outer surface directable towards a source of IR radiation and an inner surface;
an electrical insulator having an upper surface in engagement with the inner surface of the layer and a lower surface;
a membrane having an upper surface in engagement with the lower surface of the electrical insulator and a lower surface, the membrane having a minimal thermal capacity;
a supporting surface having an upper surface directed towards the membrane so as to define a void between the supporting surface and the membrane, the lower surface of the membrane in communication with the void;
a plurality of supports extending from the supporting surface and operatively engaging the membrane to suspend the membrane above the supporting surface;
first and second terminals electrically coupled to the layer;
a circuit electrically coupled to the first and second terminals, the circuit configured to:
provide one of a constant voltage across the first and second terminals to generate an electrical current flowing through the layer and a constant electrical current across the first and second terminals to generate a voltage across the first and second terminals;
monitor a change in the electrical current flowing through the layer in response to the IR radiation absorbed by the layer when the constant voltage is provided across the first and second terminals;
monitor a change of the voltage across the first and second terminals in response to the IR radiation absorbed by the layer when the constant electrical current is provided across the first and second terminals; and
determine the IR radiation absorbed by the layer in response to one of the monitored change in the electrical current flowing through the layer and the monitored change of the voltage across the first and second terminals;
wherein the layer defines an uninterrupted electrical path from the first terminal to the second terminal and from the second terminal to the first terminal.

15. The IR detection sensor of claim 14 wherein the membrane is flexible.

16. The IR detection sensor claim 14 wherein each nanowire of the plurality of nanowires is fabricated from silicon impregnated with silver nanoparticles.

17. The IR detection sensor of claim 14 wherein each nanowire of the plurality of nanowires includes a terminal first end partially defining an inner surface of the layer and a second end.

18. The IR detection sensor of claim 17 wherein the second end of each nanowire of the plurality of nanowires has a generally conical configuration and terminates at a tip.

19. The IR detection sensor of claim 18 wherein the tip at the second end of each nanowire of the plurality of nanowires partially defines the outer surface of the layer and wherein the inner surface of the layer engaging an electrical insulator.

* * * * *